United States Patent [19]

Pissanetzky

[11] Patent Number: 5,592,090
[45] Date of Patent: Jan. 7, 1997

[54] COMPACT, OPEN GEOMETRY U-SHAPED MAGNET FOR MAGNETIC RESONANCE IMAGING

[75] Inventor: Sergio Pissanetzky, The Woodlands, Tex.

[73] Assignee: Houston Advanced Research Center, The Woodlands, Tex.

[21] Appl. No.: 354,282

[22] Filed: Dec. 12, 1994

[51] Int. Cl.$^6$ .................................................. G01V 3/00
[52] U.S. Cl. ............................................ 324/319; 324/318
[58] Field of Search .................................... 324/300, 307, 324/309, 318, 319, 320, 322

[56] References Cited

U.S. PATENT DOCUMENTS

| | | | |
|---|---|---|---|
| 3,434,085 | 3/1969 | Gang | 335/297 |
| 4,587,490 | 5/1986 | Muller et al. | 324/320 |
| 4,667,174 | 5/1987 | MacKinnon et al. | 324/318 |
| 4,761,614 | 8/1988 | Prammer et al. | 324/320 |
| 4,771,785 | 9/1988 | Duer | 324/318 |
| 4,791,370 | 12/1988 | MacKinnon | 324/318 |
| 4,899,109 | 2/1990 | Tropp et al. | 324/320 |
| 4,985,678 | 1/1991 | Gangarosa et al. | 324/318 |
| 4,987,371 | 1/1991 | Glover et al. | 324/320 |
| 5,006,804 | 4/1991 | Dorri et al. | 324/320 |
| 5,008,624 | 4/1991 | Yoshida | 324/318 |
| 5,168,232 | 12/1992 | Glover et al. | 324/320 |
| 5,194,810 | 3/1993 | Breneman et al. | 324/319 |
| 5,207,224 | 5/1993 | Dickinson et al. | 128/653.5 |
| 5,291,169 | 3/1994 | Ige et al. | 335/216 |
| 5,305,749 | 4/1994 | Li et al. | 128/653.2 |
| 5,315,276 | 5/1994 | Huson et al. | 335/216 |
| 5,343,151 | 8/1994 | Cory et al. | 324/320 |

FOREIGN PATENT DOCUMENTS 9321645 10/1993 WIPO ............................... H01F 5/00

OTHER PUBLICATIONS

Minimum Energy MRI Gradient Coils of General Geometry, by Sergio Pissanetzky Meas. Sci. Technol. 3 (1992) 667–673.

Formation of a Homogeneous Magnetic Field in Spectrometer Dipole Magnet Using Permanent Magnet, by Borisov et al., IEEE Transactions on Magnetics, vol. 28, No. 1 (Jan. 1992) 568–570.

The Design and Construction of High Field–Uniformity Permanent Magnet System for MRI, by Feng et al., IEEE Transactions on Magnetics, vol. 28, No. 1, (Jan. 1992) 641–643.

Bringing MRI to More Patients, Magna–Lab, Inc. (1992).

Magnetic Field Corrections in the Cyclotron, by M. E. Rose, Physical Review, vol. 53 (May 1938) 715–719.

On a Design of Wide Range Magnet for Cyclotron, by Hiroo Kumagai, Lear Instruments and Methods 6 (1960) 213–216.

On the Design of Wide Range Electromagnets of High Homogeneity, by A. Huber and H. Primas, Lear Instruments and Methods 33 (1965) 125–130.

General Electric Preparing to Announce Extraordinary New MRI System, Superconductivity News, vol. 6, No. 16 (Jan. 1994) 1–12.

Primary Examiner—Michael Tokar
Attorney, Agent, or Firm—Vinson & Elkins L.L.P.

[57] ABSTRACT

A compact, open geometry U-shaped magnet formed by parallel iron slabs and a flux return is activated by a coil which surrounds the flux return. The inner surfaces of the iron slabs and an outer surface of the coil are substantially contiguous. The field homogeneity within the compact, open geometry U-shaped magnet is improved by controlling the reluctance of a secondary flux flow circuit extending away from the pair of parallel iron slabs. The geometry of the compact, open geometry U-shaped magnet also provides for utilization of an automatic active shimming system.

16 Claims, 5 Drawing Sheets

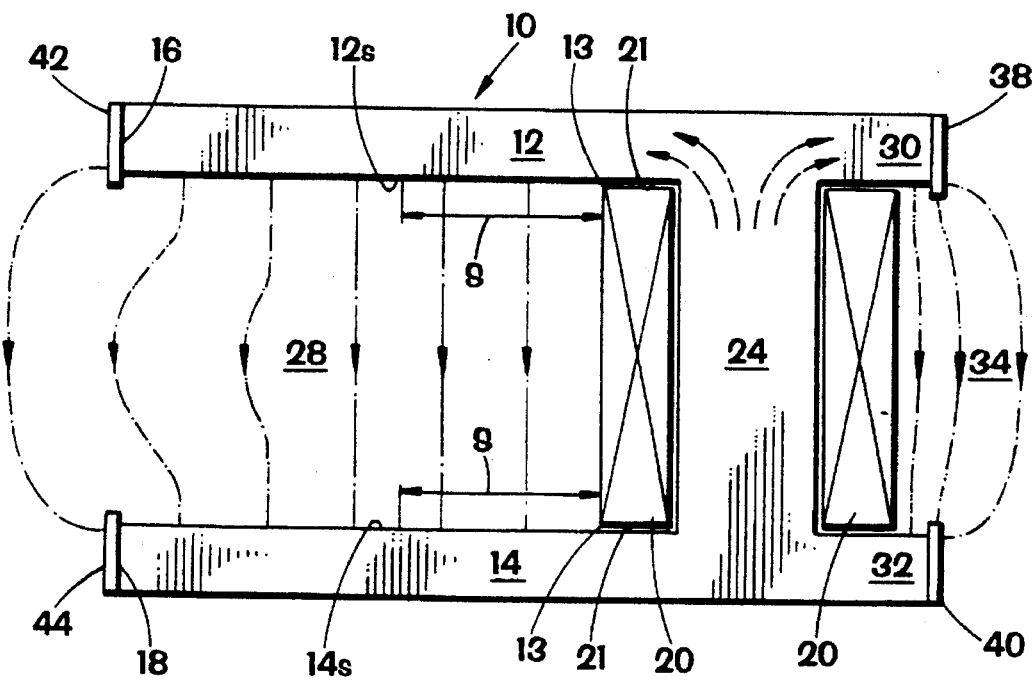
FIG. 1
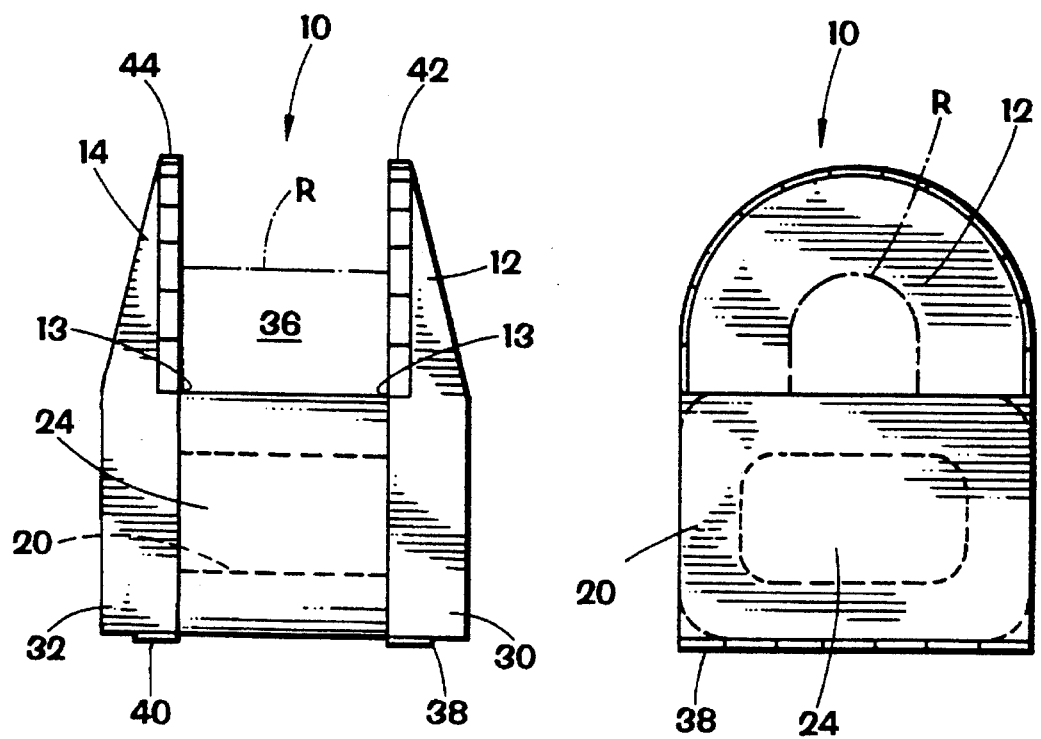
FIG. 2A
FIG. 2B

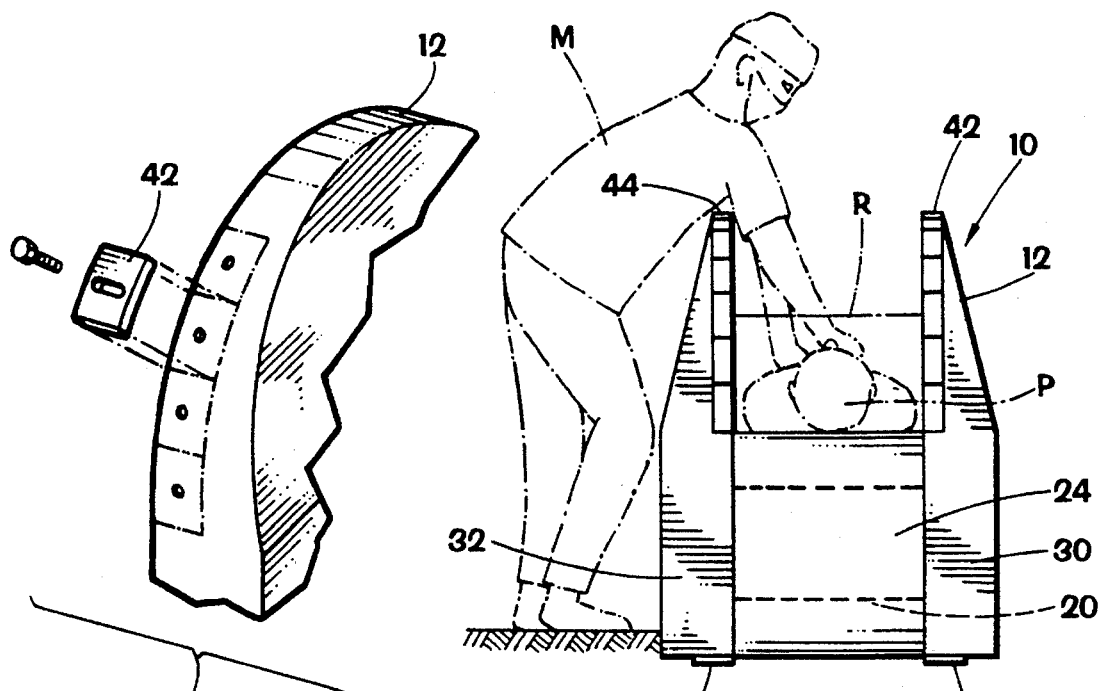
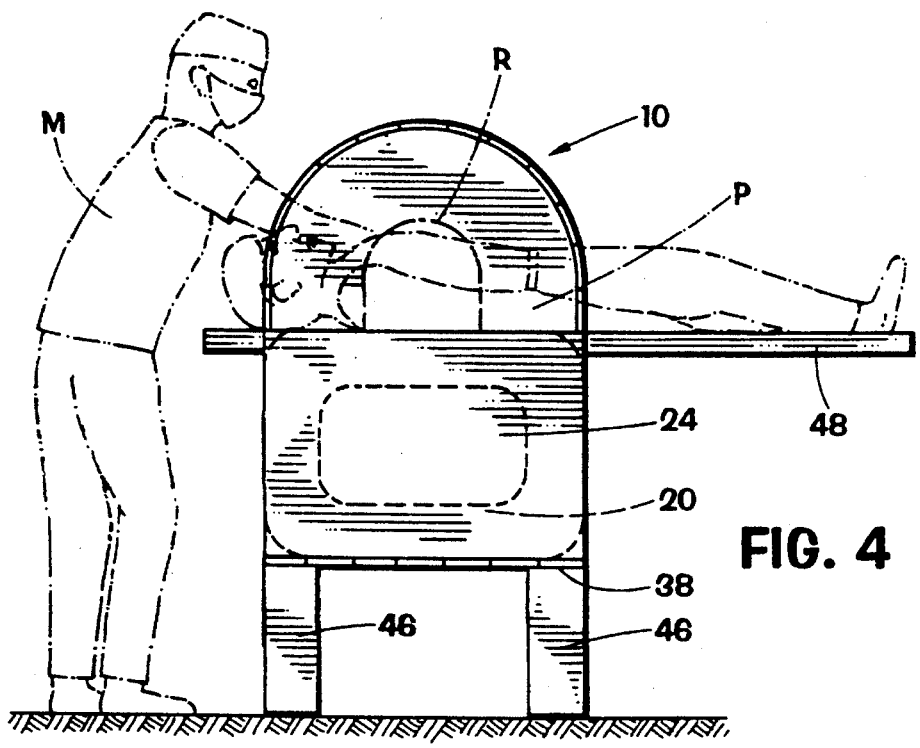

COMPACT, OPEN GEOMETRY U-SHAPED MAGNET FOR MAGNETIC RESONANCE IMAGING

FIELD OF THE INVENTION

This invention pertains to magnets; more particularly, this invention pertains to magnets used in magnetic resonance imaging.

BACKGROUND

The advent of the use of magnetic resonance imaging ("MRI") in the practice of medicine gave a whole new dimension to non-invasive diagnostics. The accuracy of non-invasive diagnostics is directly related to the accuracy of the image produced by MRI. And the accuracy of the image produced by MRI is directly related to the field homogeneity produced in the imaging region of the magnet which is the heart of an MRI device. Inhomogeneities higher than 0.1ppm within the magnetic field produced by the magnet in an MRI device can provide distortion in the images produced. Such distortion may lead to an inaccurate diagnosis which, in the worst case, can lead to improper medical treatment.

The larger the volume of flux lines with high homogeneity produced by the magnet in an MRI device, the more useful the magnet is for MRI, as larger portions of the human body can be imaged with greater accuracy. Consequently, a need exists to provide magnets for use in MRI devices that provide imaging regions with high homogeneity which can accommodate larger and larger portions of the human body.

In addition to producing large imaging regions with high homogeneity, there is also a need associated with magnets used in MRI devices to provide improved access to the patient once the patient has been placed within the imaging region. Improved patient access facilitates interventional surgery or biopsies by medical personnel and the use of life-support equipment, if needed, while the patient is within the MRI device. Improved patient access also facilitates unrestricted access to both the head of the patient to administer anesthesia, or to the groin of the patient for the insertion of a catheter. It has also been found that improved patient access assists in reducing patient apprehension from the sensation of claustrophobia common among patients placed in tubular MRI magnets.

A need also exists to minimize the size and weight of magnets used in MRI devices. Such magnets must be of a size and weight that will allow for their installation in existing operating rooms without any extensive or undue modifications to existing construction.

There is finally a need in MRI devices that the magnet be of a size which facilitates installation in a variety of different positions or alternatively rotation or translation to a variety of different positions under hydraulic or mechanical control. Such translational or rotational capability will allow the magnet to accommodate the wide range of patient positions which accompany a broad spectrum of surgical procedures or imaging requirements.

SUMMARY OF THE INVENTION

The compact, open geometry U-shaped magnet of the present invention provides a strong, highly uniform magnetic field, provides improved access to a patient, is of a size and weight that will both allow for its installation in existing operating rooms and, once installed, is easily movable to different positions.

The compact, open geometry U-shaped magnet of the present invention has a large imaging region within its bore where the magnetic field has a very high homogeneity. The imaging region in the U-shaped magnet of the present invention is physically described by a pair of parallel iron slabs separated by an air gap. An iron flux return at one end of the air gap connects the parallel iron slabs to form the U-shape.

An energizing coil surrounds the iron flux return to establish a magnetic field within the bore of the magnet. The size and shape of the magnetic field within the bore of the magnet is formed by three boundary conditions as shown in the FIG. 1 schematic diagram. The first boundary condition is the first iron slab. The second boundary condition is the outer surface of the energizing coil, and the third boundary condition is the second iron slab. The imaging region is contained within the magnetic field formed in the bore of the magnet. Field homogeneity within the imaging region is improved by assuring that the boundary conditions are substantially contiguous about the entire boundary of the magnetic field. However, with nothing more than substantially contiguous boundary conditions, field homogeneity within the imaging region will still be unsuitable for MRI. Therefore, additional improvements to field homogeneity are still required.

It is well-known that a secondary weaker magnetic circuit will be formed on the opposite side of the iron flux return from the iron slabs. It has been found that in addition to establishing a magnetic field by substantially contiguous boundary conditions, a need also exists to adjust the reluctance of the secondary magnetic circuit to achieve the proper degree of field homogeneity in the imaging region. In the preferred embodiment, the adjustment of the reluctance in the secondary magnetic circuit is accomplished by the addition of slab extension pieces on the opposite side of the iron flux return from the parallel iron slabs.

Thus, once a magnetic field is established within the imaging region by energizing the coil surrounding the iron flux return, the slab extension pieces in the secondary magnetic circuit reduce the reluctance to flux flow in the secondary magnetic circuit, thus drawing flux flow away from the imaging region. Further adjustment of the reluctance within the secondary magnetic circuit by passive shimming of the slab extension pieces improves the field homogeneity between the parallel iron slabs, thereby creating a compact, open geometry U-shaped magnet having an imaging region particularly suitable for MRI.

The unique geometry of the compact, open geometry U-shaped magnet of the present invention also allows for the use of an automatic active shimming system. Automatic active shimming allows medical personnel to continuously obtain accurate images of internal portions of a patient's body while manipulating devices such as small catheters from outside the patient's body.

BRIEF DESCRIPTION OF THE DRAWINGS

A better understanding of the compact, open geometry U-shaped magnet for MRI of the present invention may be had by reference to the drawings wherein:

FIG. 1 is a schematic illustration of the construction of the compact open geometry U-shaped magnet of the present invention and the pattern of magnetic flux lines which surrounds the magnet and the slab extension pieces when the coil is energized;

FIG. 2A is a left-side elevational view of the preferred embodiment of the compact, open geometry U-shaped magnet shown schematically in FIG. 1 with the imaging region shown in phantom;

FIG. 2B is a front elevational view thereof;

FIG. 2C is a detail view showing the mounting of the segmented passive shims;

FIG. 3 is a view similar to FIG. 2A but with a patient contained within the imaging region within the magnet and a medical attendant working on the patient;

FIG. 4 is a view similar to FIG. 2B but with a patient contained within the imaging region within the magnet and a medical attendant working on the patient;

DESCRIPTION OF THE PREFERRED EMBODIMENTS

Background Theory

Figure 5:
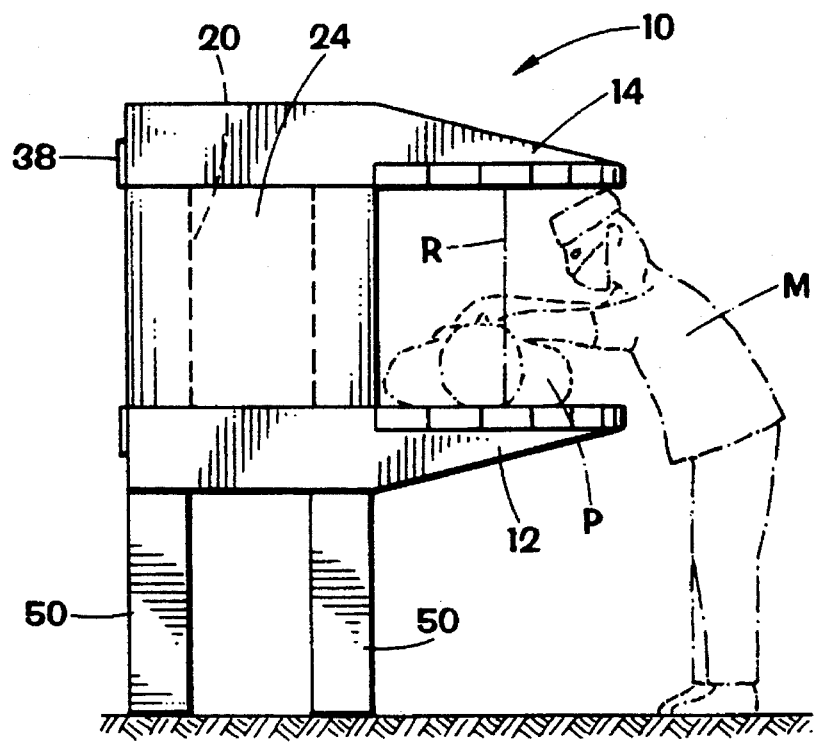
FIG. 5 is an alternate orientation of the preferred embodiment of the compact, open geometry U-shaped magnet of the present invention with a patient contained within the imaging region and a medical attendant working on the patient.

It is well-known that the magnetic field in the space between two infinite parallel plates is perfectly uniform if the infinite parallel planes are kept at different values of magnetic scalar potential. The hypothesized pair of infinite parallel plates can be approximated by two parallel slabs of unsaturated iron or other low reluctance magnetic material such as shown in FIG. 1 at 12, 14. In actual use, however, the two parallel iron slabs 12, 14 must have a finite length. Consequently, the effect of the edges 16, 18 of the slabs 12, 14 on the homogeneity on the volume of interest within the magnetic field between the slabs 12, 14 must be considered. This is particularly important in MRI, as the volume of interest is the imaging region and the field homogeneity in the imaging region has a direct impact on the quality of the image of the internal organ or body part being examined.

It is well-known that the magnetic field, H, in unsaturated iron, such as inside a flux return leg 24 as shown in FIG. 1, is very small. In fact, since the density of magnetic flux lines over a unit area, B, is equal to the product of the permeability of material, $\mu$, and the magnetic field, B, $\mu$ B, is at most, about 15,000 gauss in unsaturated iron, and $\mu$ is as large as 8,000 gauss per Oersted ("Oe") or more, and H is of the order of 2 Oe or less. This is a very small magnetic field, given that the earth's magnetic field is about 0.5 Oe.

It is also well-known in the art that $H_t$, the component of H tangential to a given boundary, remains continuous across any boundary except where electric current is present. $H_t$ then changes in proportion to the amount of electric current present. Thus, if the coil 20 as shown in FIG. 1 has the right amount of current, it is possible for $H_t$ to be very small at point A just inside the coil 20 and at the same time have a large value at point B just outside the outer surface 26 of the coil 20. The large value of $H_t$ at point B should be made equal to the value of the uniform field between the two parallel iron slabs 12, 14.

Theory in Application

As shown in FIG. 1, the two finite parallel iron slabs 12, 14 form the arms of a "U" (laying on its left arm). The base of the "U" is the iron flux return leg 24. An energizing coil 20 surrounds the iron flux return leg 24. The coil 20 may be made from a superconducting material or it may be a liquid cooled resistive coil.

Once the desired geometry for a homogeneous magnetic field is defined, the desired homogeneous magnetic field can be created by properly specifying boundary conditions. For example, a cubic region can be created by establishing planar boundary conditions on three of six sides of a cube, provided two of the planar boundary conditions are parallel. Field homogeneity is increased by maximizing the contiguity of the boundary conditions. In FIGS. 2A and 2B, the device depicted by the schematic diagram of FIG. 1 has been rotated 90°. The tops of the slabs 12, 14 have been rounded. The imaging region R, having a shape approximating a rural mailbox with a semi-cylindrical top and rectangular box bottom, is shown in phantom lines. The boundary conditions creating the imaging region R are the parallel planar iron slabs 12, 14 and the planar $H_t$ along the outer surface 26 of the coil 20. Particular attention is to be given to the corners 13 shown in FIGS. 1 and 2A. Therein, the substantial contiguity of the boundary conditions is best shown. Specifically, the ends 21 of the coil 20 and the inner sides 12s and 14s of the iron slabs 12, 14 are placed together as closely as possible at the corners 13.

As best shown in FIG. 2A, the parallel iron slabs 12, 14 are also tapered from bottom to top. As the purpose of the parallel iron slabs 12, 14 is to convey magnetic flux into the gap between the parallel iron slabs 12, 14 at the right position, the thickness of each iron slab must be proportional to the amount of flux conveyed and must be sufficient to avoid saturation. Near the outside surface 26 of coil 20, the parallel iron slabs 12, 14 convey a large amount of flux and thus must be thicker. As more and more flux leaves the slabs 12, 14 to enter the gap between the slabs, less and less flux is left for the slabs to convey. Therefore, less and less slab thickness is required. Consequently, the parallel slabs 12, 14 get progressively thinner the farther away they are from the coil 20.

The magnetic field between the parallel iron slabs 12, 14 remains perfectly uniform right next to the outer surface 26 of the coil 20. But, the magnetic field progressively decays at points deeper and deeper into the coil 20 along a line from point B to point A (FIG. 1). The magnetic field becomes very small at the inner edge of the coil 20 at point A. From there on, the boundary conditions for $H_t$, at the edge of the iron flux return leg 24, are also satisfied, and the field remains very small in the iron flux return 24. Therefore, the presence of the energizing coil 20 with its flat outer side 26 substantially contiguous to the region of high field homogeneity between the parallel iron slabs 12, 14: (a) does not disturb field homogeneity between the two parallel iron slabs 12, 14; (b) allows the region of high field homogeneity to extend outward (to the left in FIG. 1) from the flat outer side 26 of the coil 20; (c) provides the greatest appropriate boundary for the iron flux return 24; and (d) drives the magnetic flux across the bore 28 of the magnet 10 between the two parallel iron slabs 12, 14.

While an approximate rural mail-box-shaped region R is shown in the preferred embodiment, it will be understood by those of ordinary skill in the art that different imaging regions may be created by modifying the geometry of the boundary conditions while maintaining their contiguity.

Slab Extension Pieces

The positioning of the slab extension pieces 30, 32 which are parallel to, extend away from and are substantially co-planar with the two parallel iron slabs 12,14 is shown at the right-hand side of the magnet 10 in FIG. 1. The effect of the slab extension pieces 30, 32 is shown at point D. Therein it may be seen that the magnetic flux lines flowing up the flux return leg 24 divide into two paths at point D. Part of the flux lines bend to the left and form the primary flux flow circuit. The primary flux flow circuit includes an imaging region 36 (FIG. 2A) in the bore 28 of the magnet 10. The remaining flux lines bend to the right at point D and flow into the upper slab extension piece 30 and then continue across an air gap 34 and into the lower slab extension piece 32 to form a secondary flux flow magnetic circuit.

The amount of magnetic flux that flows to the left at point D in the iron flux return 24 has an important effect on field homogeneity in the imaging region 36 between the two parallel iron slabs 12, 14. Since the magnetic field at point B next to the coil is determined by the current in the coil 20 only, as explained above, any excess flux present in the upper slab 12 will flow preferentially toward a point such as point C, and will result in the magnetic field at point C being stronger than the magnetic field at point B. Conversely, if insufficient flux exists in the upper slab 12, the magnetic field at point C will be weaker than the magnetic field at point B.

It is, therefore, very important that exactly the right amount of flux be injected from point D into the upper slab 12 in FIG. 1. Failure to inject the proper amount of flux will decrease field homogeneity within the imaging region 36 within bore 28. When the magnetic flux in the iron flux return 24 is split into two paths at point D, the fraction of magnetic flux that enters either the primary or secondary flux flow magnetic circuit is determined by the relative reluctances of the primary and secondary flux flow magnetic circuits, the primary flux flow circuit being to the left of point D and the secondary flux flow circuit being to the right of point D.

Reluctance of the Secondary Flux Flow Magnetic Circuit

The reluctance of the secondary flux flow magnetic circuit to the right of point D depends on the lengths of the slab extension pieces 30, 32 and the air gap 34 between them. Therefore, it is required that the slab extension pieces 30, 32 be designed in such a way and be made of such a length that only the correct amount of magnetic flux bends to the left at point D and enters the primary flux flow magnetic circuit. It is also possible to increase the homogeneity of magnetic flux lines in the bore 28 of the magnet 10 by adjusting the width of the bore 28 between the parallel iron slabs 12, 14. However, adjusting the separation of the parallel iron slabs 12, 14 was found to be less effective than using the slab extension pieces 30, 32. Even more effective to increase field homogeneity in the primary flux flow circuit is fine adjustment of the effective length of the slab extension pieces 30, 32. This fine adjustment of the effective length of the slab extension pieces 30, 32 may be accomplished by the use of passive shims 38, 40 on the ends of the slab extension pieces 30 and 32, as discussed below.

Figure 7:
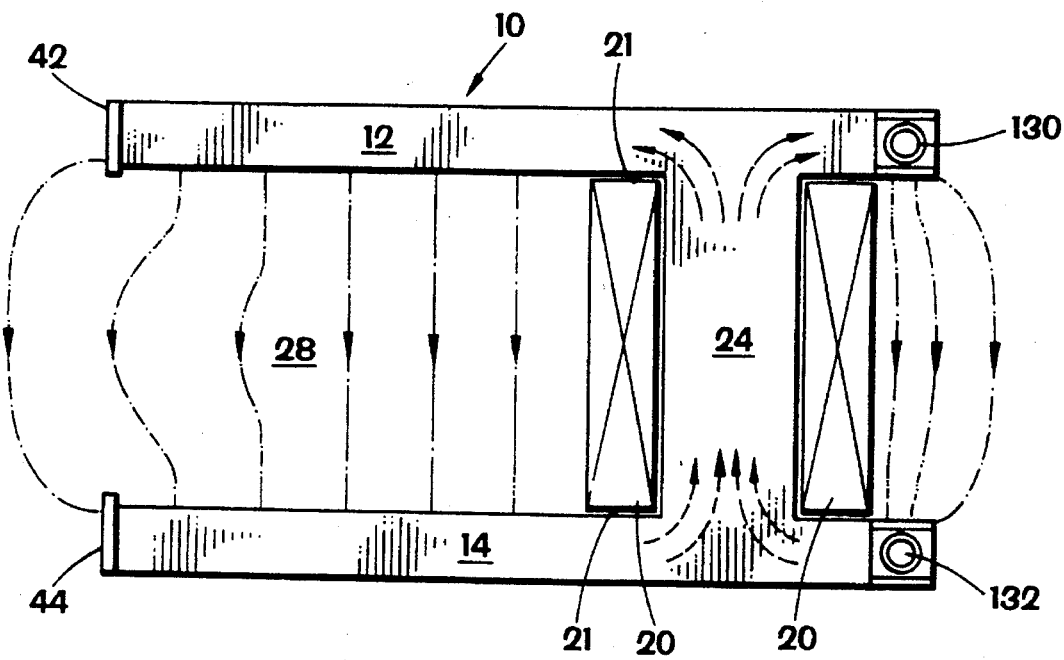
FIG. 7 is a schematic illustration of a first alternate embodiment of the compact, open geometry U-shaped magnet of the present invention.
Figure 8:
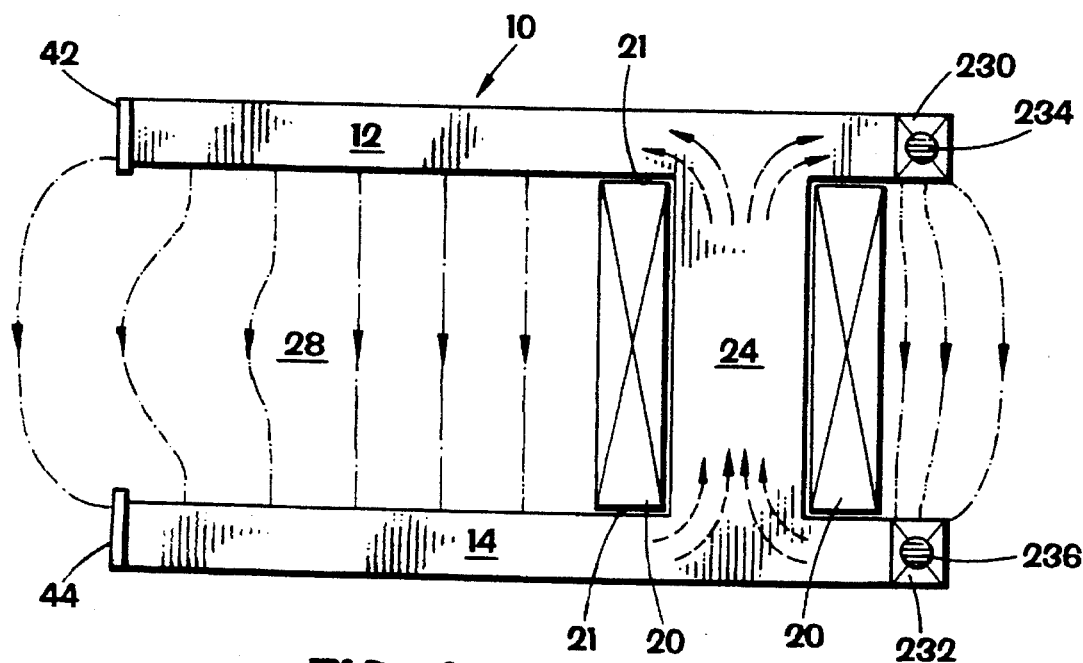
FIG. 8 is a schematic illustration of a second alternate embodiment of the compact, open geometry U-shaped magnet of the present invention.

The reluctance of the secondary flux flow circuit may also be adjusted by means other than slab extension pieces. In FIG. 7 a pair of electrically activated coils 130, 132 are used to draw magnetic flux into the secondary flux flow circuit. In FIG. 8 the slab extension pieces have been replaced by a pair of permanent magnets 230, 232 which may be adjustably positioned with respect to the parallel iron slabs 12, 14. By adjusting the current flow to the coils 130, 132 in FIG. 7 or by moving the magnets 230, 232 in FIG. 8, the reluctance of the secondary flux flow magnetic circuit can be adjusted to assure high field homogeneity in the imaging region 36.

Shimming

It is well-known that the use of segmented passive shims 42, 44 to improve field homogeneity in the imaging region 36 is recommended for two reasons. First, the segmented passive shims 42, 44 compensate for the weakening of the magnetic field near the edges of the parallel iron slabs 12, 14. Second, the segmented passive shims 42, 44 compensate for construction errors and any residual inaccuracies in the material properties of the parallel iron slabs 12, 14.

It is also well-known that at the edge of a magnet, such as the magnet 10 of the present invention, the field in the region near the edges 16, 18 (FIG. 1) will be weaker than far inside the bore 28 of the magnet. The concern, therefore, is to minimize the penetration of the volume of the weakened magnetic field near the edges 16, 18 into the bore 28 between the parallel iron slabs 12, 14. Since the area of the patient to be imaged must be entirely in the volume of high homogeneity of flux lines or the imaging region 36 to obtain an accurate image, it is desirable to keep the weakened region of flux lines near the edges 16, 18 as small as possible to maximize the size of the imaging region 36 and also to provide better patient access. As may be seen in FIG. 3, medical personnel M must reach over one of the parallel iron slabs 12 or 14 and through the weakened field near the edge 16 or 18 to gain access to the Patient P. Thus, the smaller the distance is between the edges 16, 18 and the imaging region R, the easier the access will be to the patient P.

Keeping the size of the weakened field near the edges 16, 18 as small as possible can be achieved by placing adjustable segmented passive ferromagnetic shims 42, 44 at the edges 16, 18 of the parallel iron slabs 12, 14. As may be seen in FIGS. 2 through 6, there are a plurality of segmented ferromagnetic shim pieces 42, 44 which border the perimeter of the slabs 12, 14 and extend inwardly at various distances beyond the inner faces 12s, 14sof the parallel iron slabs 12, 14. The adjustable positioning of each segmented passive ferromagnetic shim piece increases the field homogeneity in the imaging region 36. As shown in FIG. 2C, such adjustable positioning of individual shim segments is accomplished by forming a slot 17 in the shim and then passing a bolt 19 through the slot. The bolt threadably engages an arm of the magnet 10. Tightening the shim segments against the arms 12, 14 holds the shim segments in position. A typical dimension for a minimum depth of the weakened field near the edges 16, 18 of the parallel iron slabs 12, 14 (which dimension is achieved only after careful adjustment of the position of the segmented ferromagnetic shims 42, 44 with respect to the parallel iron slabs 12, 14) is one-half of the separation distance between the slabs 12, 14. This method of passively shimming with adjustable shim segments at the edges of a magnet is traditional and well-known.

Passive Shimming and the Extension Pieces

The length of the slab extension pieces 30, 32 shown in FIG. 1, as well as their separation 34, is used to determine the amount of magnetic flux that enters the parallel iron slabs 12, 14 and thus the quality of the resulting homogeneous field in the imaging region 36. Both the amount of magnetic flux and the quality of the magnetic field can be further adjusted by placing segmented passive ferromagnetic shims 38, 40 at the edge of the extension pieces 30, 32. Segmented passive ferromagnetic shims 38, 40 are bolted to extension pieces 30, 32 in the same way that the segmented passive ferromagnetic shims 42, 44 are mounted to the iron slabs 12, 14.

The segmented passive shims 38, 40 are used, in combination with an experimental map of the magnetic field in the homogeneous region, for fine adjustment of the reluctance of the secondary magnetic circuit shown at the right-hand side of FIG. 1. The size and position of all the segmented passive shims 38, 40, 42, 44 indicated in FIG. 1 varies along a dimension perpendicular to the long axis of the magnet 10 to better compensate for any remaining field inhomogeneity in the imaging region 36.

Utilization Configurations

FIGS. 3 through 6 show possible ways of using the magnet 10 of the present invention for interventional MRI with a patient "P." Specifically, FIGS. 3 and 4 show the orientation of the magnet 10 of the present invention in general use, including: i)surgery on any part of the body, ii) guided catheter insertion, or iii) guided biopsies. Note that improved access to the head, chest and feet of the patient P in FIGS. 3 and 4 will allow medical personnel M to easily have access to three areas of the patient at one time. In FIG. 4, the magnet 10 is positioned by mounting it on a pair of legs 46. A slab 48 may be used to support the legs of the patient.

FIG. 5 indicates yet another way of using the magnet 10 of the present invention. The patient P is placed on one of the parallel iron slabs 12 or 14. Such position provides easy access to the patient's chest, an orientation particularly useful in cardiac surgery. The pair of legs 50 are positioned to establish a convenient height for the magnet 10.

Figure 6:
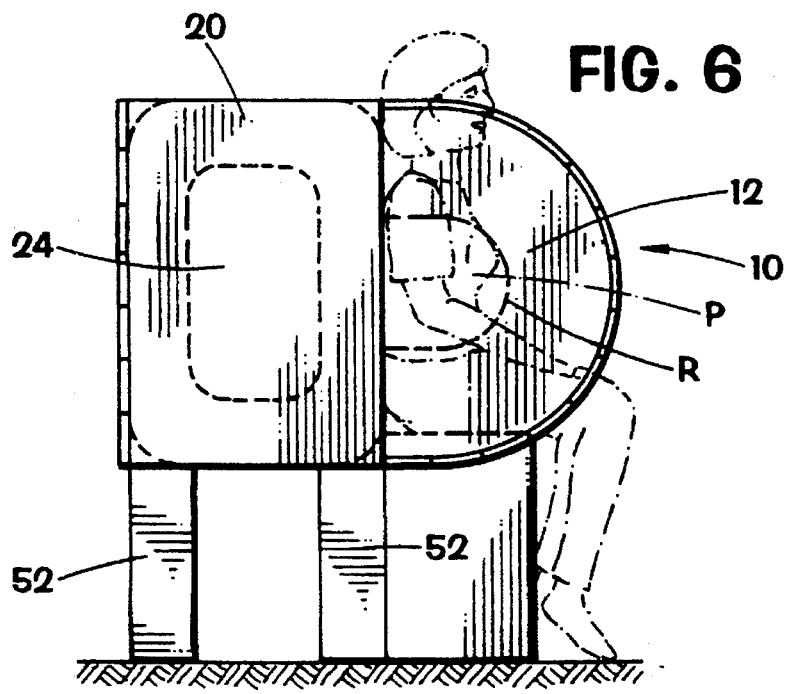
FIG. 6 is yet another alternate orientation of the preferred embodiment of the compact, open geometry U-shaped magnet of the present invention.

FIG. 6 illustrates an application of the magnet 10 of the present invention for diagnosing breast cancer or facilitating MRI-guided biopsies. Legs 52 position the height of the magnet 10.

As may be specifically seen in FIGS. 3, 4 and 5, medical personnel M must reach through the weakened field near the edges 16, 18 to gain access to the patient P. Thus, while patients are in magnetic fields for only short periods of time, medical personnel M are exposed to magnetic fields for prolonged periods. Because this may be a possible health hazard to medical personnel, it is necessary to minimize the strength of the magnetic field to which medical personnel M are exposed. Unlike tubular magnets where the strength of the magnetic field surrounding the imaging region is stronger than in the imaging region itself, the geometry of the compact, open geometry U-shaped magnet 10 of the present invention provides an imaging region R which is surrounded by a weakened field. Thus, the strongest magnetic field is within the imaging region rather than surrounding the imaging region as in prior art tubular magnets. Therefore, when the magnet 10 of the present invention is used for interventional MRI, it is an advantage that medical personnel M reach only through a weakened field and thereby minimize prolonged and possibly undesirable exposure to strong magnetic fields.

It is possible to use the magnet 10 for a variety of applications if the compact, open geometry U-shaped magnet is installed on a hydraulically or mechanically movable platform (not shown) capable of either translating or rotating the magnet 10 of the present invention to a variety of different positions.

Custom utilization of the magnet 10 may be made if the magnet 10 is specially sized to accommodate body party such as arms or legs. It is also possible to size the magnet 10 so that it may be specially used to produce images of just hands or feet. Such smaller magnets may also be used in pediatric, neonatal, or even veterinary applications.

Active Shimming

Passive shimming using adjustably positioned iron segments, as previously described, is typically used to correct coarse inaccuracies in field homogeneity. Passive shimming alone, however, is generally not the preferred way to bring a magnetic field within the strict homogeneity and performance requirements needed for accurate MRI. Generally, an active shimming system is used to meet the strict MRI homogeneity and performance requirements in the imaging region 36. In comparison, passive shimming brings the magnetic field generally within a range of correction where the active shimming system becomes most effective. Additionally, passive shimming also provides a base level of field homogeneity suitable for using a Nuclear Magnetic Resonance ("NMR") measuring probe to determine the amount of correction required by an active shimming system to achieve the desired level of field homogeneity in the imaging region. In order to effectively use an active shimming system, it is necessary for the boundary conditions establishing the magnetic field to be oriented so that sensors and coils S (FIG. 1), typically forming a part of an active shimming system, may be placed adjacent to the imaging region 36. In the preferred embodiment of the present invention the geometry of the magnet 10 allows for placement of the sensors and coils S, typically used in an active shimming system, on the inner surfaces 12s, 14sof the parallel iron slabs 12, 14 and on the outer surface 26 of the coil 20 as shown in FIG. 9.

The active shimming system usable with the magnet 10 of the present invention consists of several independent flat coils 80 placed along the boundary conditions forming the imaging region 36. Each flat coil 80 is capable of producing at least one spherical harmonic component of the magnetic field in the imaging region 36.

The currents in the flat coils 80 of the active shimming system are determined automatically by sending the output of the sensors to a computer, then having the computer determine the required coil current. Unlike prior art MRI devices, the geometry of the magnet 10 of the present invention permits such computer-driven automatic active shimming to occur continuously while the patient P is within the imaging region 36. Thus, there is no need to remove the patient from the imaging region to insert an NMR probe, take measurements, calculate correction currents, make coil current adjustments and reinsert the patient back into the imaging region 36. Rather, any change in field homogeneity, such as occurs by movement of the hands of medical personnel M, is picked up by the sensors. The output of the sensors is used to calculate the adjustments needed to maintain field homogeneity in the imaging region 36. Such field homogeneity adjustments are mathematically transformed into changes in the amount of electric current supplied to the flat coils 80. Thus, when medical personnel are being guided by an image produced using the magnet 10 of the present invention, they will notice that their movements may tend to reduce the quality of the image viewed; however, by waiting just a few moments for the automatic active shimming system to correct the current to flat coils 80, the accuracy of the viewed image will be restored.

Figure 9:
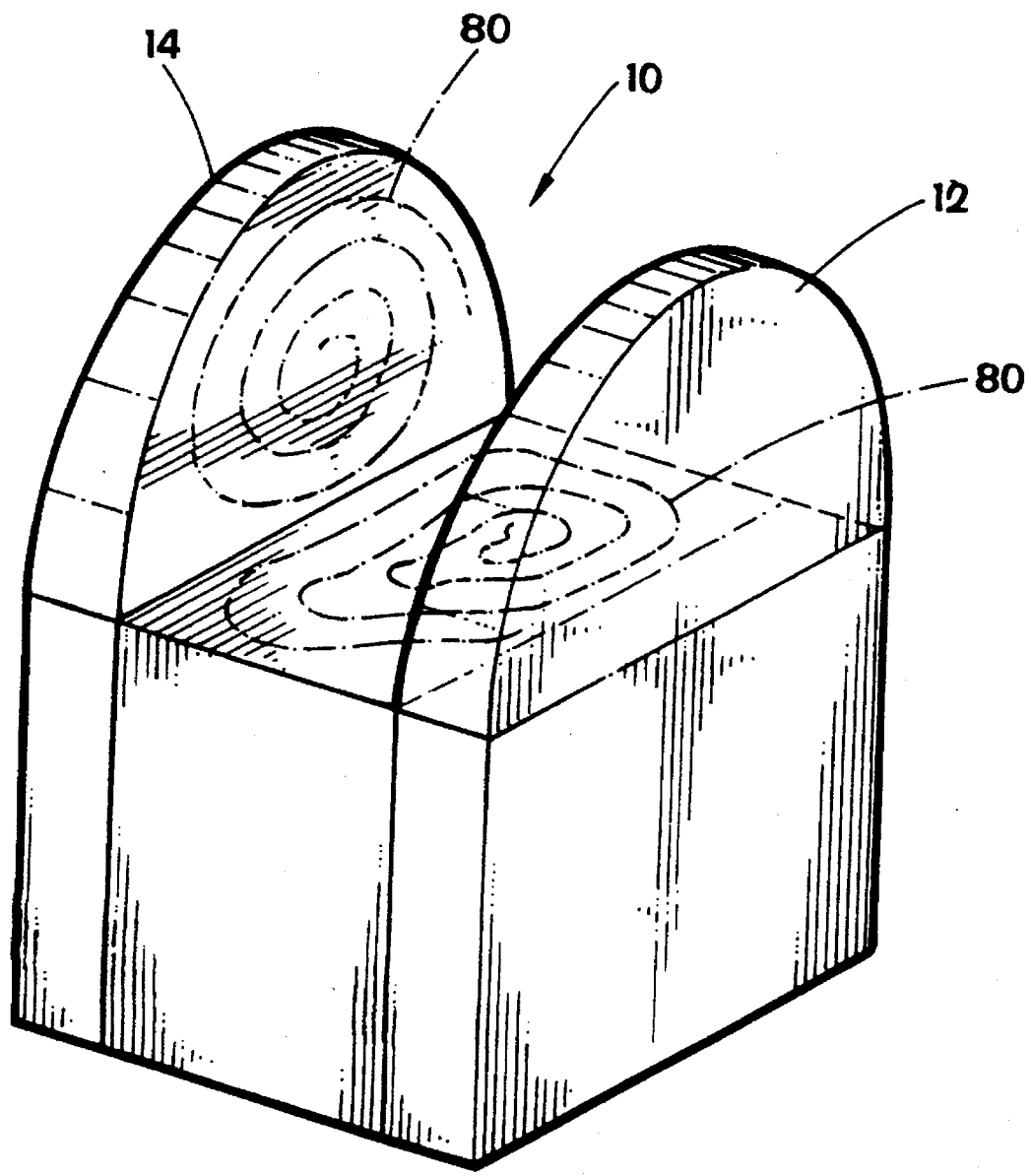
FIG. 9 is a perspective view of the compact, open geometry U-shaped magnet of the present invention with one of the parallel iron slabs shown in phantom to illustrate the automatic active shimming system.

Note that in FIG. 9, the flat active shimming system coils 80 are contained in plates located on the boundary conditions of the magnet 10. These shimming system coils 80 follow complicated patterns determined by computer analysis of the imaging region R, which patterns are specifically tailored to provide the required corrections necessary to fine-tune the magnetic field in the imaging region 36 so that it may be effectively used for MRI.

There is thereby provided by the compact, open geometry U-shaped magnet of the present invention a method for creating a strong, highly uniform magnetic field imaging region, providing improved access to a patient within the magnet while still allowing for installation and movement of the magnet within existing operating rooms.

I claim:

1. A compact, open geometry magnet for performing magnetic resonance imaging, said compact, open geometry magnet comprising:
   a substantially U-shaped structure defining an imaging region, said substantially U-shaped structure including:
      a pair of parallel iron slabs forming the arms of said U-shaped structure, said pair of parallel iron slabs having inner faces;
      an iron flux return passing between said pair of parallel iron slabs and forming the connecting leg of said U-shaped structure;
   a coil surrounding said iron flux return so that the surface of said coil is substantially contiguous with the inner faces of said pair of parallel iron slabs; and
   adjustable means for drawing flux flow away from said substantially U-shaped structure located on the opposite side of said iron flux return from said parallel iron slabs.

2. The compact, open geometry magnet as defined in claim 1 wherein said adjustable means for drawing flux flow away from said substantially U-shaped structure is a pair of slab extension pieces formed integrally with said parallel iron slabs and extending away from said imaging region.

3. The compact, open geometry magnet as defined in claim 2 further including segmented passive shims adjustably attached to the ends of said pair of slab extension pieces.

4. The compact, open geometry magnet as defined in claim 1 wherein said adjustable means for drawing flux flow away from said substantially U-shaped structure is a pair of electrically actuated coils positioned on the opposite side of said iron flux return from said parallel iron slabs.

5. The compact, open geometry magnet as defined in claim 1 wherein said adjustable means for drawing flux flow away from said substantially U-shaped structure is a pair of adjustably positionable permanent magnets, each of said adjustably positionable pair of permanent magnets positioned on the opposite side of said iron flux return from said parallel iron slabs.

6. A compact, open geometry U-shaped magnet for performing magnetic resonance imaging, said magnet having a homogeneous magnetic field imaging region, and comprising:
   a pair of parallel iron slabs having inner faces;
   an iron flux return passing between said pair of parallel iron slabs;
   said pair of parallel iron slabs and said iron flux return forming the "U" shape;
   a coil surrounding said iron flux return so that the surface of said coil is substantially contiguous with the inner faces of said pair of parallel iron slabs;
   adjustable means for drawing flux flow away from the imaging region located on the opposite side of said iron flux return from said parallel iron slabs;
whereby increased homogeneity of flux lines between said parallel iron slabs is obtained by the creation of a pattern of flux lines by said adjustable means for drawing flux flow away from the imaging region.

7. The compact, open geometry U-shaped magnet as defined in claim 6 wherein said adjustable means for drawing flux flow away from the imaging region is a pair of slab extension pieces formed integrally with said parallel iron slabs and extending away from said imaging region.

8. The compact, open geometry magnet as defined in claim 7 further including segmented passive shims adjustably positioned on the ends of said slab extension pieces.

9. The compact, open geometry magnet as defined in claim 6 wherein said adjustable means for drawing flux flow away from said substantially U-shaped structure is a pair of electrically actuated coils positioned on the opposite side of said iron flux return from said parallel iron slabs.

10. The compact, open geometry magnet as defined in claim 6 wherein said adjustable means for drawing flux flow away from said substantially U-shaped structure is a pair of adjustably positionable permanent magnets, each of said pair of adjustably positionable permanent magnets positioned on the opposite side of said iron flux return from said parallel iron slabs.

11. A method of obtaining a homogeneous pattern of magnetic flux lines in the imaging region in a magnetic resonance imaging magnet having two arms and a base surrounding a bore to form a "U" shape, said method comprising the steps of:
   placing adjustable means for drawing flux flow away from the imaging region, on the opposite side of the base of the U-shaped magnet from its bore;
   surrounding the base between the arms of said U-shaped magnet with a coil so that the outer surface of said coil and the inner surface of the arms are substantially contiguous;
   passing electrical energy through said coil;
whereby the pattern of magnetic flux lines caused by said adjustable means for drawing flux flow away from the imaging region creates a homogeneous magnetic field between the arms of said U-shaped magnet.

12. A method of obtaining greater homogeneity of flux lines within a magnet, said method comprising the steps of:
   forming a substantially U-shaped structure with a magnetic field imaging region therein defined by:
      a pair of substantially parallel iron slabs forming the arms of said U-shaped structure;
      an iron flux return path formed between said substantially parallel iron slabs forming the connecting leg of said substantially U-shaped structure;

surrounding said iron flux return with a coil so that the outer surface of said coil and the inner surface of said parallel iron slabs is substantially contiguous;

causing flux lines to pass from said iron flux return through said arms in between said substantially parallel iron slabs by passing an electric current through the coil;

using adjustable means extending away from said arms to enhance the division of the flux flow in the iron flux return so that a sufficient portion of said flux flow is drawn away from said imaging region whereby a magnetic field of high homogeneity is created within said imaging region.

13. The method as defined in claim 12 further including the steps of:

placing field homogeneity sensors and field homogeneity adjustment coils on said inner surfaces of said parallel iron slabs and said outer surface of said coil;

using the output of said field homogeneity sensors to calculate current changes to said field homogeneity adjustment coils;

providing said calculated current changes to said field homogeneity adjustment coils.

14. A method of obtaining greater homogeneity of flux lines in a magnet, said method comprising the steps of:

forming a substantially U-shaped structure with an imaging region therein defined by:
  a pair of substantially parallel iron slabs forming the arms of said U-shaped structure;
  an iron flux return path formed between said substantially parallel iron slabs forming the connecting leg of said substantially U-shaped structure;

surrounding said iron flux return with a coil so that the outer surface of said coil is substantially contiguous with the inner surface of said parallel iron slabs;

causing magnetic flux lines to pass from said iron flux return through said arms and between said substantially parallel iron slabs by passing an electric current through said coil to form a first flux pattern;

forming a second flux pattern opposite said first flux pattern, said second flux pattern having sufficient difference in reluctance with respect to the reluctance of said first flux pattern to create a high degree of field homogeneity in said imaging region.

15. The method as defined in claim 13 further including the step of adjusting the reluctance of said second flux pattern to further enhance the homogeneity of the flux lines in said imaging region.

16. The method as defined in claim 14 further including the steps of:

placing field homogeneity sensors and computer generated field homogeneity adjustment coils on said inner surface of said parallel iron slabs and said outer surface of said coil;

continuously providing the output of said field homogeneity sensors to a computer;

using said computer to transform the output of said field homogeneity sensors into electrical current changes to be provided to said field homogeneity adjustment coils;

continuously providing said computer generated electrical current changes to said field homogeneity adjustment coils.

\* \* \* \* \*